United States Patent
Ponoth et al.

(10) Patent No.: US 9,059,270 B2
(45) Date of Patent: Jun. 16, 2015

(54) REPLACEMENT GATE MOSFET WITH RAISED SOURCE AND DRAIN

(71) Applicant: International Business Machines Corporation, Armonk, NY (US)

(72) Inventors: Shom Ponoth, Clifton Park, NY (US); David V. Horak, Essex Junction, VT (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 144 days.

(21) Appl. No.: 13/772,892

(22) Filed: Feb. 21, 2013

(65) Prior Publication Data
US 2013/0161697 A1    Jun. 27, 2013

Related U.S. Application Data

(62) Division of application No. 12/913,922, filed on Oct. 28, 2010, now Pat. No. 8,946,006.

(51) Int. Cl.
*H01L 29/78* (2006.01)
*H01L 29/66* (2006.01)

(52) U.S. Cl.
CPC .......... *H01L 29/78* (2013.01); *H01L 29/66545* (2013.01); *H01L 29/66553* (2013.01); *H01L 29/66628* (2013.01); *H01L 29/7834* (2013.01)

(58) Field of Classification Search
CPC .............. H01L 29/78; H01L 29/66545; H01L 29/66553; H01L 29/66628; H01L 29/7834
See application file for complete search history.

(56) References Cited

U.S. PATENT DOCUMENTS

| | | |
|---|---|---|
| 2004/0259303 A1 | 12/2004 | Lee et al. |
| 2010/0184265 A1* | 7/2010 | Maitra et al. ............... 438/303 |
| 2011/0156107 A1 | 6/2011 | Bohr et al. |

OTHER PUBLICATIONS

U.S. Official Action mailed May 16, 2012 in related U.S. Appl. No. 12/913,922.
U.S. Official Action mailed Oct. 18, 2012 in related U.S. Appl. No. 12/913,922.

\* cited by examiner

*Primary Examiner* — Long Pham
(74) *Attorney, Agent, or Firm* — Scully, Scott, Murphy & Presser, P.C.

(57) ABSTRACT

A disposable dielectric spacer is formed on sidewalls of a disposable material stack. Raised source/drain regions are formed on planar source/drain regions by selective epitaxy. The disposable dielectric spacer is removed to expose portions of a semiconductor layer between the disposable material stack and the source/drain regions including the raised source/drain regions. Dopant ions are implanted to form source/drain extension regions in the exposed portions of the semiconductor layer. A gate-level dielectric layer is deposited and planarized. The disposable material stack is removed and a gate stack including a gate dielectric and a gate electrode fill a cavity formed by removal of the disposable material stack. Optionally, an inner dielectric spacer may be formed on sidewalls of the gate-level dielectric layer within the cavity prior to formation of the gate stack to tailor a gate length of a field effect transistor.

17 Claims, 9 Drawing Sheets

REPLACEMENT GATE MOSFET WITH RAISED SOURCE AND DRAIN

CROSS REFERENCE TO RELATED APPLICATION

This application is a divisional of U.S. patent application Ser. No. 12/913,922, filed Oct. 28, 2010 the entire content and disclosure of which is incorporated herein by reference.

BACKGROUND

The present disclosure relates to semiconductor structures, and particularly to a replacement gate metal-oxide-semiconductor field effect transistor (MOSFET) having raised source/drain regions and methods of manufacturing the same.

As semiconductor devices shrink in each generation of semiconductor technology, the size of source and drain regions of a MOSFET decreases and the resistance of the source and drain regions increases correspondingly. While raised source/drain structures formed by selective epitaxy increase the thickness of source/drain regions and reduce source/drain resistance, a selective epitaxy process requires an elevated temperature, which tends to diffuse dopant atoms in source/drain extension regions that define the channel length of the MOSFET. Thus, the thermal cycling associated with selective epitaxy employed to form raised source/drain regions has a deleterious effect on performance of the MOSFET by variations in the channel length, which depend on the accuracy of temperature control during the epitaxy. However, precise control of the channel length is critical in providing uniform and reliable performance for a MOSFET.

BRIEF SUMMARY

A disposable dielectric spacer is formed on sidewalls of a disposable material stack. Raised source/drain regions are formed on planar source/drain regions by selective epitaxy. The disposable dielectric spacer is removed to expose portions of a semiconductor layer between the disposable material stack and the source/drain regions including the raised source/drain regions. Dopant ions are implanted to form source/drain extension regions in the exposed portions of the semiconductor layer. A gate-level dielectric layer is deposited and planarized. The disposable material stack is removed and a replacement gate stack including a gate dielectric and a gate electrode fills a cavity formed by removal of the disposable material stack. Optionally, an inner dielectric spacer may be formed on sidewalls of the gate-level dielectric layer within the cavity prior to formation of the gate stack to tailor a gate length of a field effect transistor.

According to an aspect of the present disclosure, a method of forming a semiconductor structure is provided, which includes: forming a disposable material stack on a semiconductor substrate; forming a disposable dielectric spacer on sidewalls of the disposable material stack; forming raised source/drain regions on the semiconductor substrate; removing the disposable dielectric spacer to form a cavity between the disposable material stack and the raised source/drain regions; forming source/drain extension regions in the semiconductor substrate by introducing dopants into semiconductor portions through the cavity; forming a gate-level dielectric layer over the source/drain extension regions and the raised source/drain regions; and replacing the disposable material stack with a gate stack including a gate dielectric and a gate electrode.

According to another aspect of the present disclosure, a semiconductor structure includes a field effect transistor located on a semiconductor substrate. The field effect transistor includes: a semiconductor portion including a body region, source/drain extension regions laterally contacting the body region, and planar source/drain regions laterally contacting the source/drain extension regions and having a same type of doping as the source/drain extension regions; a gate stack, from bottom to top, of a gate dielectric and a gate conductor, wherein the gate stack contacts the body region and a portion of each of the source/drain extension regions; and raised source/drain regions having a same type of doping as the source/drain extension regions, wherein each of the raised source/drain regions contacts a top surface of the planar source/drain regions and is laterally spaced from the gate stack by a same distance.

DETAILED DESCRIPTION

As stated above, the present disclosure relates to a replacement gate metal-oxide-semiconductor field effect transistor (MOSFET) having raised source/drain regions and methods of manufacturing the same, which are now described in detail with accompanying figures. It is noted that like and corresponding elements mentioned herein and illustrated in the drawings are referred to by like reference numerals. The drawings are not necessarily in scale.

Figure 1:
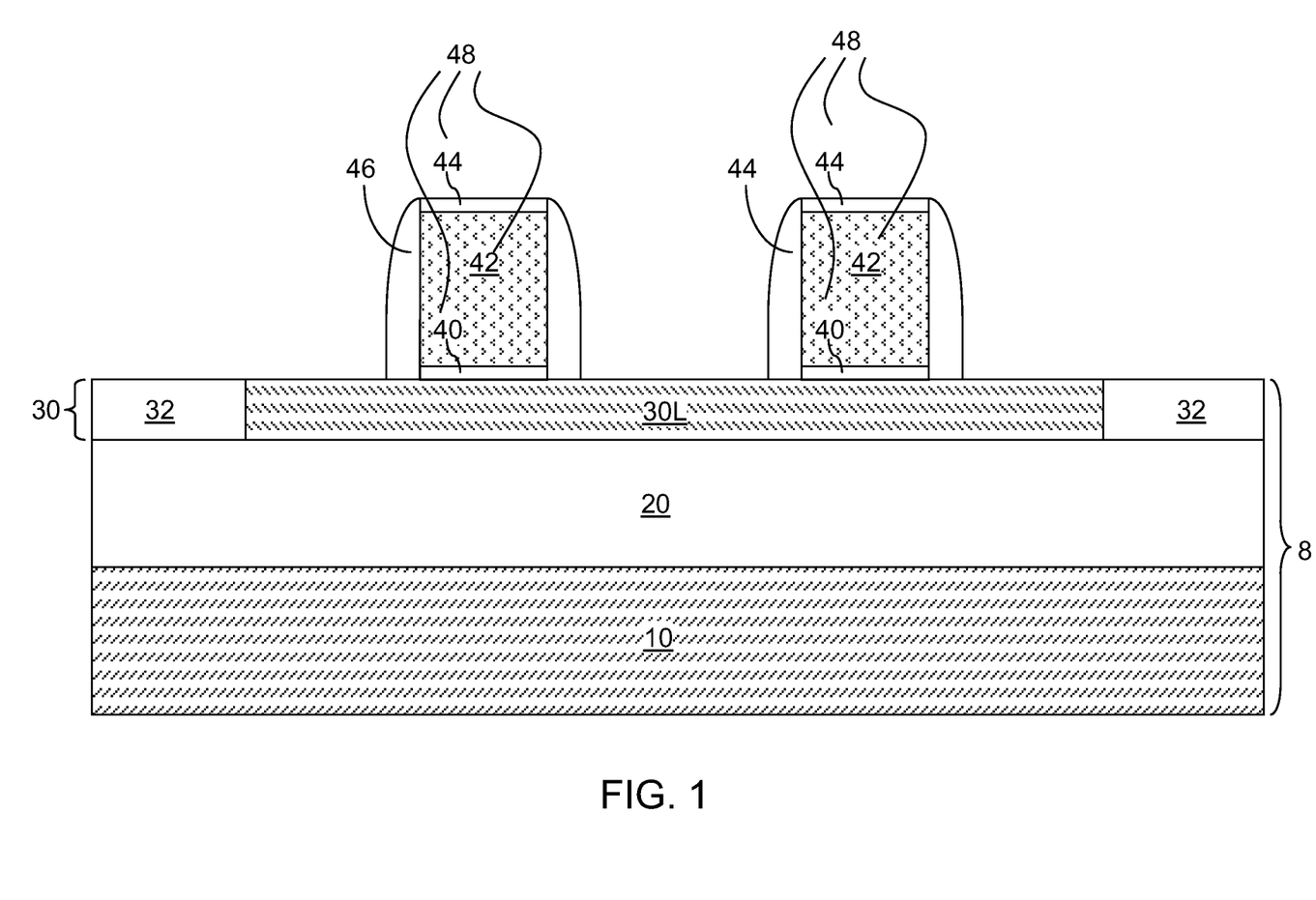
FIG. 1 is a vertical cross-sectional view of a first exemplary semiconductor structure after formation of disposable material stacks and disposable dielectric spacers according to a first embodiment of the present disclosure.

Referring to FIG. 1, a first exemplary semiconductor structure according to a first embodiment of the present disclosure includes a semiconductor substrate 8. The semiconductor substrate 8 can be a bulk semiconductor substrate including an active region 30L and isolation structures 32, or can be a semiconductor-on-insulator (SOI) substrate including a stack, from bottom to top, of a handle substrate 10, a buried insulator layer 20, and a top semiconductor layer 30 that includes an active region 30L and isolation structures 32. The active region 30L can be a single crystalline semiconductor material portion in which semiconductor atoms are epitaxially aligned to one another in the entirety thereof. The isolation structures 32 include a dielectric material such as silicon oxide and/or silicon nitride. For example, the isolation structures 32 can be shallow trench isolation structures known in the art. In one embodiment, the SOI substrate can be an ultrathin SOI substrate in which the thickness of the top semiconductor layer 30 is from 10 nm to 50 nm. In this embodiment, the isolation structures 32 can be shallow trench isolation structures having top surfaces that are coplanar with a top surface of the active region 30L and having bottom surfaces that are coplanar with a bottom surface of the active region 30L.

The active region 30L is composed of a semiconductor material such as silicon, a silicon containing alloy, a germanium containing alloy, a III-V compound semiconductor, or a III-IV semiconductor. Preferably, the entirety of the top semiconductor layer 30 is single crystalline. The active region 30L can be intrinsic or be doped with dopants of a first conductivity type, which can be p-type or n-type. Typically, the dopant concentration of the active region is from $1.0 \times 10^{14}/cm^3$ to $3.0 \times 10^{18}/cm^3$, although lesser and greater dopant concentrations can also be employed.

At least one disposable material stack 48 is formed on the surface of the semiconductor substrate 8, i.e., on the top surface of the active region 30L. The at least one disposable material stack 48 can be formed by depositing at least one blanket layer such that the topmost surface of the at least one blanket layer is a dielectric surface. In one embodiment, the at least one blanket layer can be a stack, from bottom to top, of a lower disposable dielectric material layer, a disposable non-dielectric material layer, and an upper disposable dielectric material layer. The lower disposable dielectric material layer can be, for example, a silicon oxide layer or a silicon nitride layer. The disposable non-dielectric material layer can be, for example, a polycrystalline or amorphous semiconductor material layer. The upper disposable material layer can be, for example, a silicon nitride layer or a silicon oxide layer. Alternately, the at least one blanket dielectric layer can be a single dielectric material layer or a stack of a plurality of dielectric material layers. For example, the at least one blanket dielectric material layer can be a single silicon nitride layer. The total thickness of the at least one blanket dielectric layer can be from 50 nm to 300 nm, although lesser and greater thicknesses can also be employed.

The at least one blanket layer is lithographically patterned to form the at least one disposable material stack 48. Each of the at least one disposable material stack can include, for example, a stack, from bottom to top, of a lower disposable dielectric material portion 40, a disposable non-dielectric material portion 42, and an upper disposable dielectric material portion 44. While the present embodiment is illustrated with at least one disposable material stack including a particular combination of material portions, one of ordinary skill in the art would appreciate that different material stacks or a single material portion can be employed for each of the at least one disposable material stack 48 provided that the entirety of the topmost surface of each at least one disposable material stack 48 is a dielectric surface, and the bottommost portion of the at least one disposable material stack 48 includes a material that is different from the material of the active region 30L so that the at least one disposable material stack 48 may be subsequently removed selective to the semiconductor material of the active region 30L.

Because the at least one disposable material stack 48 is formed by lithographically patterning the blanket layers, the sidewalls of the at least one disposable material stack 48 are substantially vertical. Further, sidewalls of the various portions within the at least one disposable material stack 48 are vertically coincident. For example, the sidewalls of the lower disposable dielectric material portion 40, the disposable non-dielectric material portion 42, and the upper disposable dielectric material portion 44 can coincide with one another in a top-down view.

A disposable dielectric spacer 46 is formed on sidewalls of each disposable material stack 48. Each disposable dielectric spacer 46 includes a dielectric material such as silicon nitride, silicon oxynitride, and/or silicon oxide. Each disposable dielectric spacer 46 can be formed simultaneously by depositing a conformal dielectric material layer, for example, by chemical vapor deposition, and by performing an anisotropic etch that removes horizontal portions of the conformal dielectric material layer. The remaining portions of the conformal dielectric material layer forms the disposable dielectric spacer(s) 46. The inner sidewalls of each disposable dielectric spacer 46 can be vertical, and the upper portion of the outer sidewalls of each disposable dielectric spacer 46 can be convex. The lower portion of the outer sidewall of each disposable dielectric spacer 46 can be vertical or convex. The width of each disposable dielectric spacer 46, as measured at the base of the disposable dielectric spacer 46 can be from 5 nm to 100 nm, although lesser and greater widths can also be employed.

After formation of the at least one disposable dielectric spacer 46, all exposed surfaces of the at least one disposable material stack 48 and the at least one disposable dielectric spacer 46 include dielectric materials.

Figure 2:
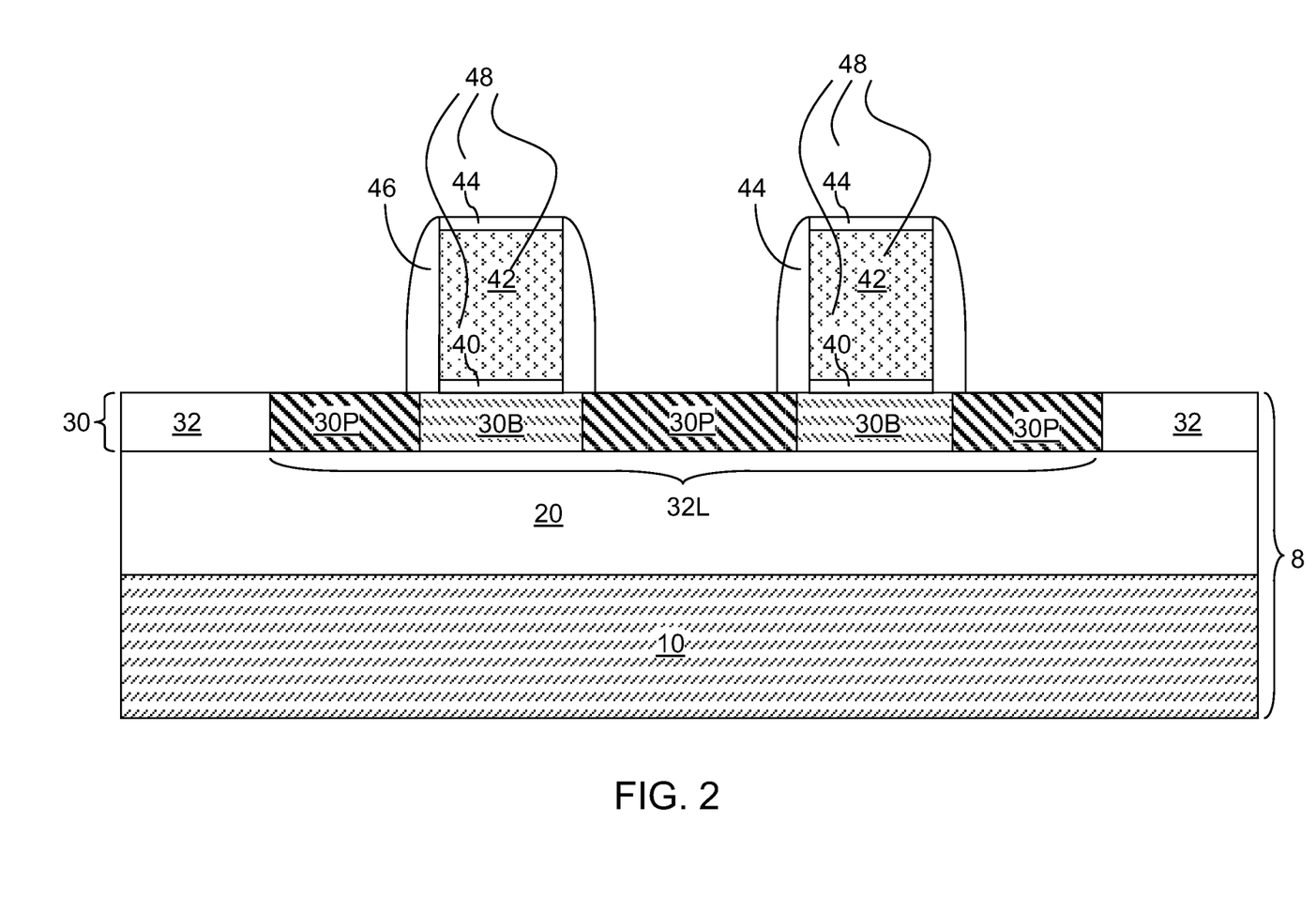
FIG. 2 is a vertical cross-sectional view of the first exemplary semiconductor structure of FIG. 1 after formation of planar source/drain regions.

Referring to FIG. 2, source/drain implantation is performed to form planar source/drain regions 30P. As used herein, a "source/drain" region can be a source region or a drain region depending on subsequent wiring and application of voltages during operation of a field effect transistor. Specifically, the planar source/drain regions 30P can be formed by implanting dopants of a second conductivity type, which is the opposite of the first conductivity type. For example, if the first conductivity type is p-type, the second conductivity type is n-type, and vice versa. If the active region 30L includes an intrinsic semiconductor material, the second conductivity type can be either p-type or n-type. At least one block mask (not shown) may be employed to confine the area of implantation of the dopants of the second conductivity type. A one block mask can be, for example, a lithographically patterned photoresist layer. The dopants of the second conductivity type can be implanted by conventional ion implantation in an ion implantation apparatus, or can be implanted during plasma doping, or by outdiffusion from a disposable dopant-containing material layer (not shown) such as an arsenosilicate glass layer. An activation anneal can be performed to activate the implanted dopants in the planar source/drain regions 30P.

The non-implanted regions of the active region 30L are herein referred to as body regions 30B, which have a doping of the first conductivity type. If the active region 30L is a single crystalline semiconductor material portion, the body region(s) 30B and the planar source/drain regions 30P in the active region 30L are epitaxially aligned to one another.

While only one active region 32L is illustrated in FIG. 2, a plurality of active regions can be formed in the top semiconductor layer 30 in some embodiments of the present disclosure. In such embodiments, first-type active regions may include p-doped body regions and n-doped planar source/drain regions, and second-type active regions may include n-doped body regions and p-doped planar source/drain regions.

Figure 3:
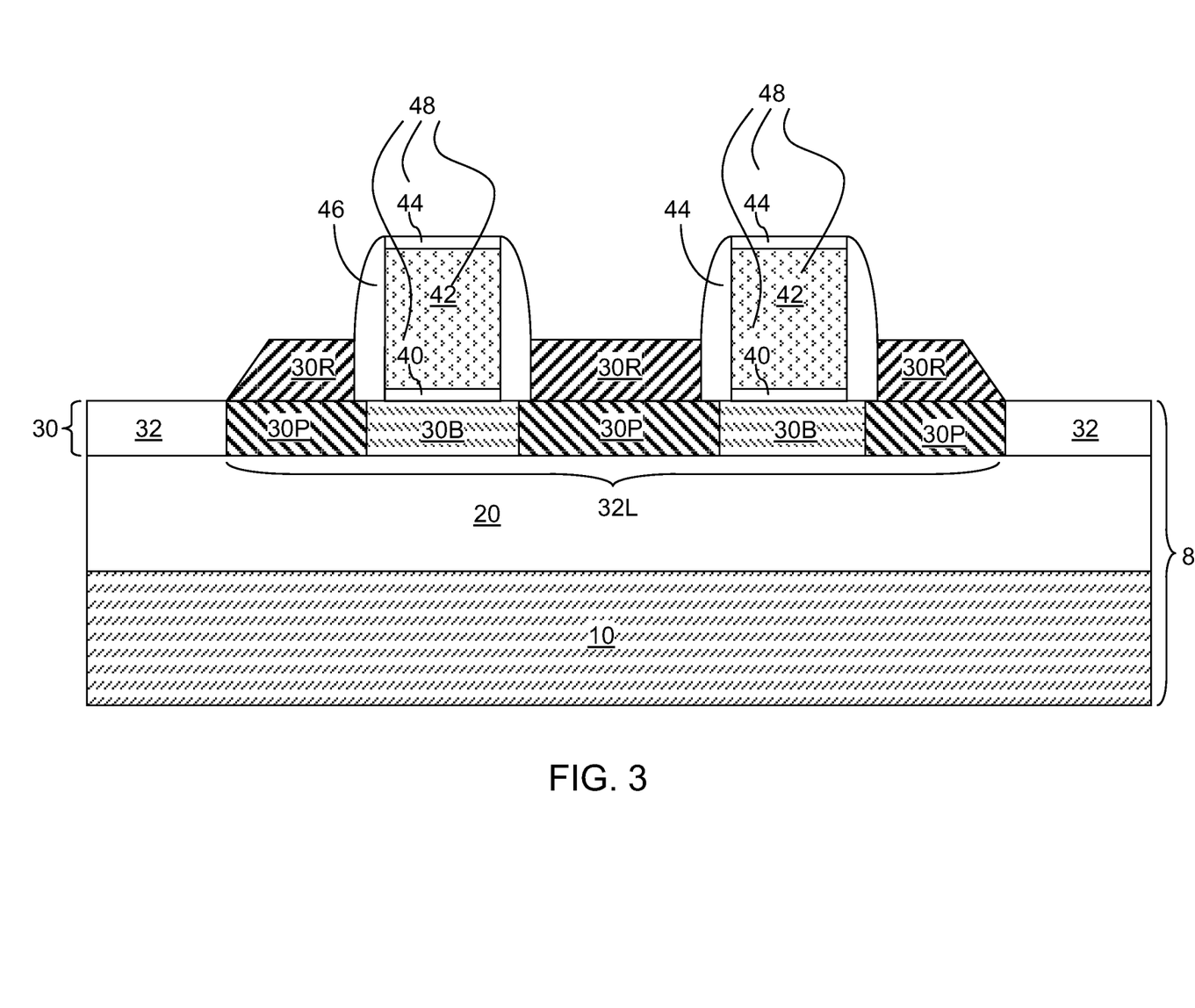
FIG. 3 is a vertical cross-sectional view of the first exemplary semiconductor structure of FIG. 2 after formation of raised source/drain regions.

Referring to FIG. 3, raised source/drain regions 30R are formed on the exposed surfaces of the planar source/drain regions 30P by selective epitaxy. Specifically, the raised source/drain regions 30R are formed by selective epitaxy that deposits a semiconductor material directly on the planar source/drain regions 30P such that the semiconductor material does not nucleate on dielectric surfaces during the selective epitaxy.

The selective epitaxy can be performed, for example, by a chemical vapor deposition (CVD) process that employs at least one reactant gas and at least one etchant gas that are flowed, simultaneously or sequentially, into a process chamber in which the first exemplary semiconductor structure is placed. Typically, a carrier gas such as hydrogen, nitrogen, argon, or helium is also flowed during the CVD process. Reactant gases that may be employed for selective epitaxy include, but are not limited to, $SiH_4$, $Si_2H_6$, $SiH_2Cl_2$, $SiHCl_3$, $SiCl_4$, $GeH_4$, and $Ge_2H_6$. Etchant gases that may be employed for selective epitaxy include, but are not limited to, HCl. In some selective epitaxy processes, byproducts of the reactant gas can provide etching (e.g., $SiH_2Cl_2$, $SiHCl_3$) obviating the need to flow a separate etchant gas. The temperature of the selective epitaxy process can be from 500° C. to 1100° C., and typically from 650° C. to 950° C., although lesser and greater temperatures can also be employed.

The thickness of the raised source/drain regions 30R, as measured between a pair of a top surface and a bottom surface of a raised source/drain region 30R, is less than the height of the at least one disposable material stack 48, and can be from 5 nm to 100 nm, although lesser and greater thicknesses can also be employed. While the semiconductor material does not nucleate on any dielectric surface during the selective epitaxy, the raised source/drain regions 30R grow along lower portions of the disposable dielectric spacer 46 so that each of the raised source/drain regions 30R contacts a lower portion of an outer sidewall of a disposable dielectric spacer 46. Some of the raised source/drain regions 30R may include facets that are formed naturally during the selective epitaxy process due to preference of certain crystallographic orientations for epitaxial growth. Such facets may be at a non-orthogonal angle with planar surfaces of the first exemplary structure, e.g., the top surfaces of the isolation structures 32.

In case the active region 30L is a single crystalline semiconductor material portion, the raised source/drain regions 30R are epitaxially aligned to the planar source/drain regions 30P. The semiconductor material of the raised source/drain regions 30R can be the same as, or different from, the semiconductor material of the planar source/drain regions 30P. For example, the raised source/drain regions 30R and the planar source/drain regions 30P can include the same semiconductor material such as silicon, germanium, a silicon-germanium alloy, a silicon-carbon alloy, or a compound semiconductor material. Alternately, the raised source/drain regions 30R and the planar source/drain regions 30P can include two different materials selected from silicon, germanium, silicon-germanium alloys having various silicon-to-germanium ratios, silicon-carbon alloys having various silicon-to-carbon ratios, and various compound semiconductor materials.

In one embodiment, the raised source/drain regions 30R are formed as intrinsic semiconductor regions, i.e., regions including an intrinsic semiconductor material. In this embodiment, no dopant gas is flowed during the selective epitaxy. The raised source/drain regions 30R are doped with dopants of the second conductivity type by implanting dopants of the second conductivity type. The dopants of the second conductivity type can be implanted by conventional ion implantation in an ion implantation apparatus, or can be implanted during plasma doping, or by outdiffusion from a disposable dopant-containing material layer (not shown) such as an arsenosilicate glass layer. In some cases, the processing steps of FIG. 2 may be omitted and the doping of the planar source/drain regions 30P can be performed at this step simultaneously with the doping of the raised source/drain regions 30R. In such cases, the implantation energy and/or dopant drive-in conditions are adjusted to ensure that dopants of the second conductivity type reach portions of the active region 32 through the raised source/drain regions 30R. An activation anneal can be performed to activate the implanted dopants in the raised source/drain regions 30R and/or the planar source/drain regions 30P.

In another embodiment, the raised source/drain regions 30R are formed as doped semiconductor regions having a doping of the second conductivity type. In this embodiment, a dopant gas of the second conductivity type is flowed during the selective epitaxy to provide in-situ doping. Exemplary dopant gases include, but are not limited to, $B_2H_6$, $PH_3$, $AsH_3$, and $SbH_3$. Typically, an activation anneal is not necessary for raised source/drain regions 30R formed by a selective epitaxy process employing in-situ doping because dopants are activated upon deposition in such processes.

While only one active region 32L is illustrated in FIG. 3, a plurality of active regions can be formed in the top semiconductor layer 30 in some embodiments of the present disclosure. In such embodiments, n-doped raised source/drain regions can be formed on n-doped planar source/drain regions located in first-type active regions, and p-doped raised source/drain regions can be formed on p-doped planar source/drain regions located in second-type active regions. If intrinsic semiconductor regions are formed during a selective epitaxy process, masked ion implantations can be performed to implant p-type dopants and n-type dopants sequentially to form the n-doped raised source/drain regions and the p-doped raised source/drain regions. Alternately, at least one dielectric mask (not shown) may be employed to perform two selective epitaxy processes, in which one is a selective epitaxy process that provides in-situ doping of p-type and the other is a selective epitaxy process that process in-situ doping of n-type. The at least one dielectric mask can be removed after each selective epitaxy process.

Figure 4:
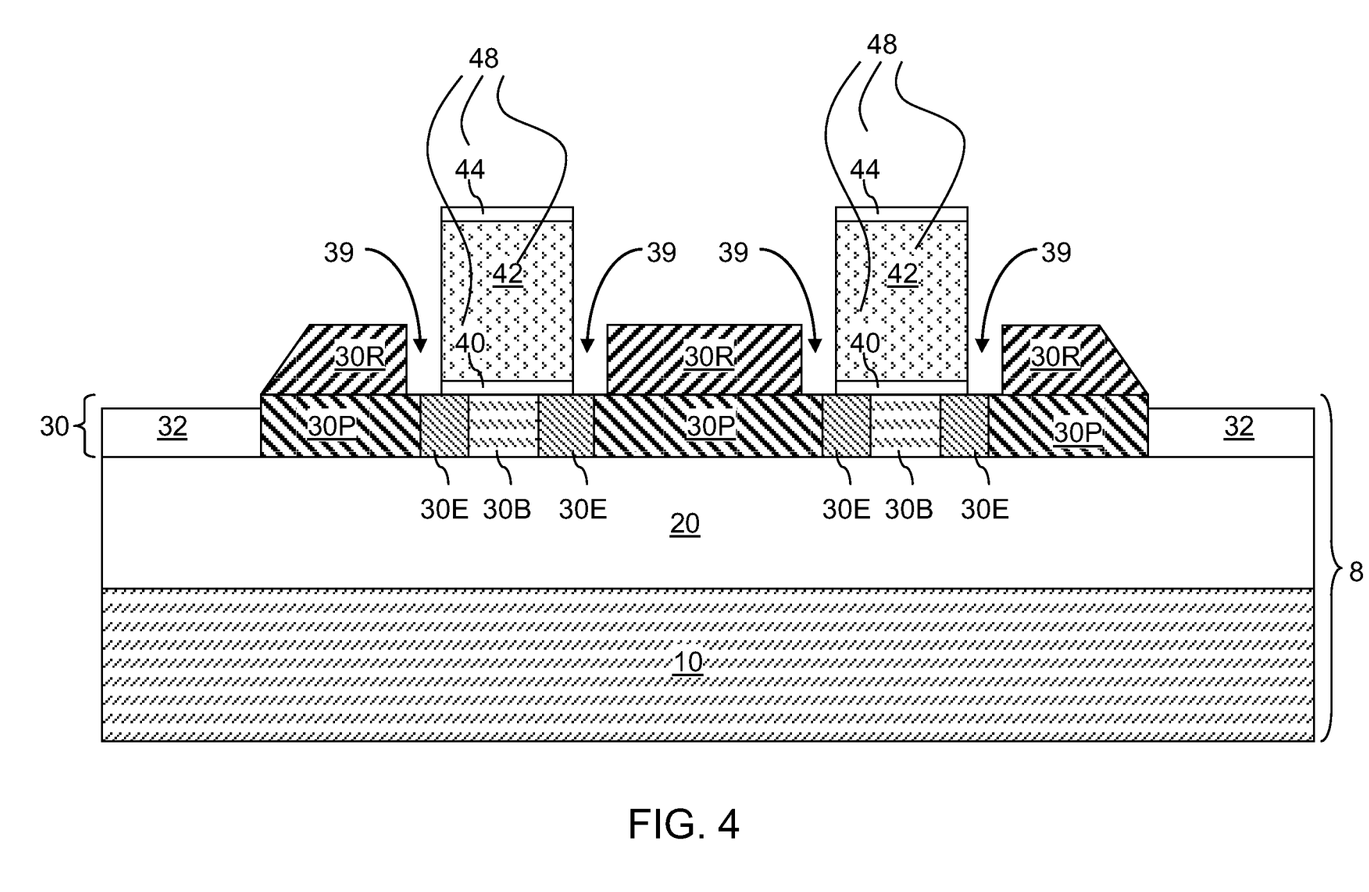
FIG. 4 is a vertical cross-sectional view of the first exemplary semiconductor structure of FIG. 3 after removal of the disposable dielectric spacers.

Referring to FIG. 4, the disposable dielectric spacer 46 is removed to form a cavity 39 between each disposable material stack 48 and adjacent raised source/drain regions 30R. The disposable dielectric spacer 46 is removed selective to lower portions of the at least one disposable material stack 48. Peripheral portions of the top surfaces of the body region(s) 30B and the planar source/drain regions 30P are exposed at a bottom surface of the cavities 39.

Source/drain extension implantation is performed to form source/drain extension regions 30E. Specifically, dopants of the second conductivity type are implanted through the cavities 39 into portions of the active region 30L (See FIG. 3) located underneath the cavities 39. If the active region 30L is a single crystalline semiconductor portion, the source/drain extension regions 30E are formed within the single crystalline semiconductor portion. The dopants can be implanted by ion implantation or by plasma doping.

Typically, the planar source/drain regions 30P have a dopant concentration that is greater than the dopant concentration of the source/drain extension regions 30E. Thus, the additional second-conductivity-type dopants that are implanted into the planar source/drain regions 30P merely increase the dopant concentration in portions of the planar source/drain regions 30P that are implanted with the additional second-conductivity-type dopants. Thus, the boundaries between body regions 30B and the planar source/drain regions 30P become boundaries between the source/drain extension regions 30E and the planar source/drain regions. The dopant concentration of the planar source/drain regions 30P can be from $3.0\times10^{20}/cm^3$ to $3.0\times10^{21}/cm^3$, although lesser and greater dopant concentrations can be also be employed. The dopant concentration of the source/drain extension regions 30E can be from $1.0\times10^{19}/cm^3$ to $3.0\times10^{20}/cm^3$, although lesser and greater dopant concentrations can be also be employed.

A body region 30B having a doping of the first conductivity type underlies a center portion of a disposable material stack 48. Two source/drain extension regions 30E laterally contact the body region 30B. Two planar source/drain regions 30P laterally contact the two source/drain extension regions 30E. The top surface of the body region 30B, the top surfaces of the source/drain extension regions 30E, and the top surfaces of the planar source/drain region 30P are located within a same horizontal plane. Further, interfaces between pairs of a planar source/drain region 30P and the raised source/drain region 30R contacting the planar source/drain region 30P are located within the same horizontal plane.

In one embodiment, the source/drain extension regions 30E extend to the top surface of the buried insulator layer 20. In another embodiment, the source/drain extension regions 30E do not contact the top surface of the buried insulator layer 20.

The dopants in the source/drain extension regions 30E can be activated by performing an activation anneal, which can be rapid thermal anneal (RTA) or a laser anneal. This anneal is the last activation anneal in the processing sequence of the present disclosure. Thus, the dopants implanted into the source/drain extension regions 30E are subjected to only minimal thermal cycling that is sufficient to activate the dopants in the source/drain extension regions. Consequently, a sharp p-n junction can be formed between a body region 30B and a pair of source/drain extension regions laterally contacting the body region 30B. The channel length of a transistor can be defined with minimal impact from process variations of thermal anneal processes. Thus, performance variations among field effect transistors can be minimized.

Figure 5:
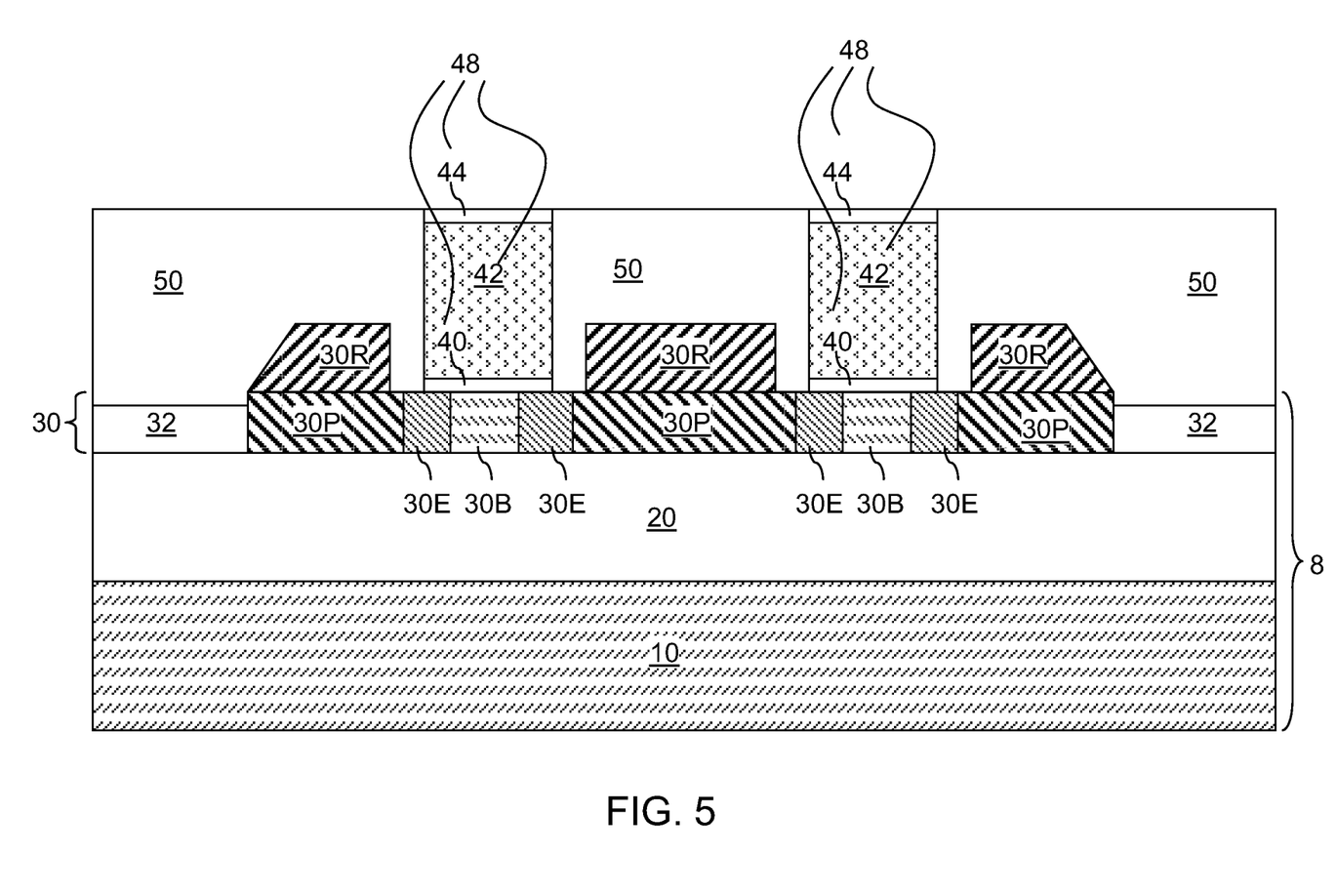
FIG. 5 is a vertical cross-sectional view of the first exemplary semiconductor structure of FIG. 4 after deposition and planarization of a gate-level dielectric layer.

Referring to FIG. 5, a gate-level dielectric layer 50 is formed over the source/drain extension regions 30E, the raised source/drain regions 30R, and the at least one disposable material stack 48. The gate level dielectric layer 50 is formed at the gate level, i.e., at least between the top surfaces of the isolation structure 32 and the top surfaces of the disposable material stacks 48. The gate-level dielectric layer 50 includes a dielectric material such as undoped silicate glass, doped silicate glass, organosilicate glass (OSG), or a porous dielectric material. In one embodiment, the gate-level dielectric layer 50 can include a porous or non-porous low dielectric constant (low-k) material having a dielectric constant less than 2.7. The gate-level dielectric layer 50 can be subsequently planarized to remove the portion above the at least one disposable material stack 48. After planarization, the top surfaces of the at least one disposable material stack 48 is coplanar with the top surface of the gate-level dielectric layer 50. The gate-level dielectric layer 50 contacts top surfaces of the source/drain extension regions 30E (at peripheries thereof), top surfaces of the planar source/drain region 30P (at peripheries thereof), and sidewalls and the top surfaces of the raised source/drain regions 30R. Further, the gate-level dielectric layer 50 also contacts vertical sidewalls of the at least one disposable material stack 48.

Figure 6:
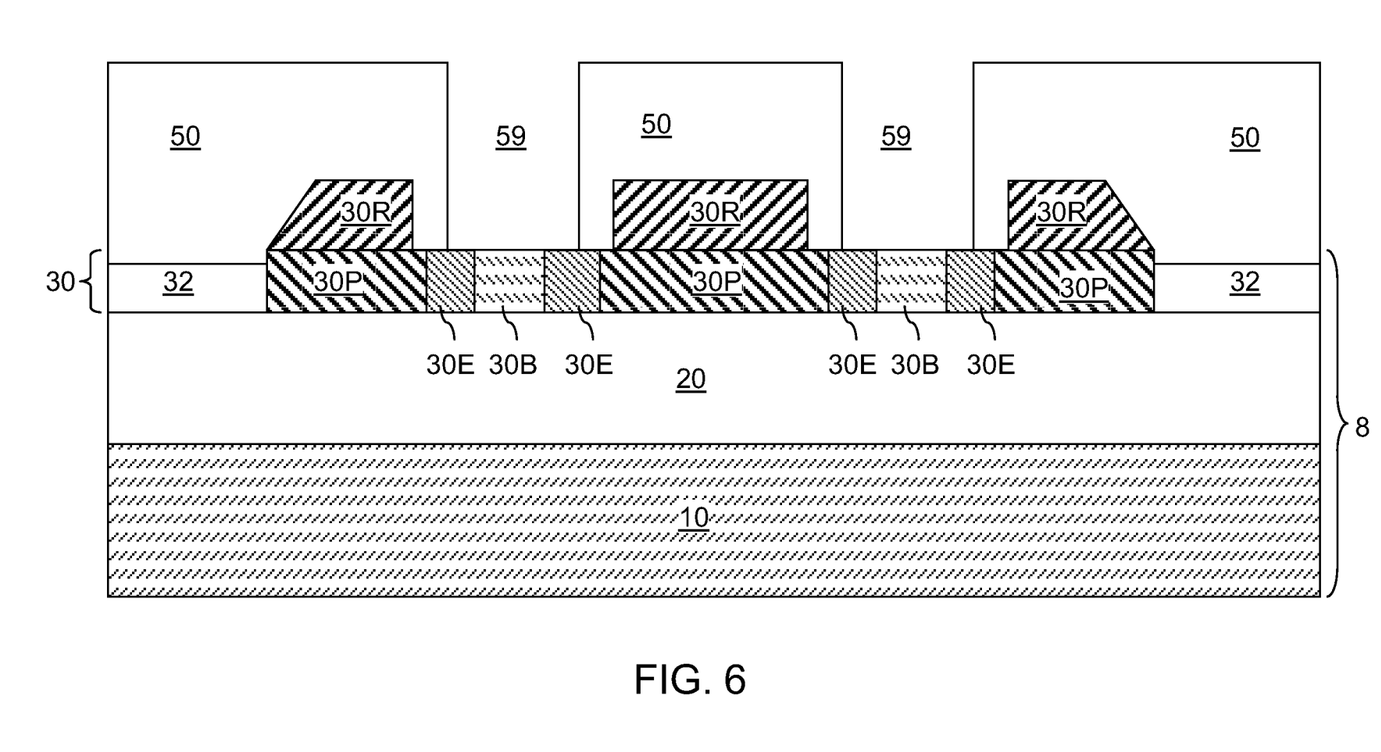
FIG. 6 is a vertical cross-sectional view of the first exemplary semiconductor structure of FIG. 5 after removal of the disposable material stacks.

Referring to FIG. 6, the at least one disposable material stack 48 is removed selective to the gate-level dielectric layer 50 and the semiconductor material of the body region(s) 30B and the source/drain extension regions 30E. The removal of the at least one disposable material stack 48 can be effected, for example, by at least one first isotropic or anisotropic etch that removes the material(s) in the at least one disposable material stack 48 while not removing the materials of the gate-level dielectric layer 50, followed by at least one second isotropic or anisotropic etch that removes the bottommost portion(s) of the at least one disposable material stack 48 while not removing, or only marginally removing, the semiconductor material of the body region(s) 30B and the source/drain extension regions 30E.

A gate cavity 59 is formed in each space from which one of the at least one disposable material stack 48 is removed. An entirety of a top surface of a body region 30B and peripheral portions of the source/drain extension regions 30E are exposed at a bottom surface of each gate cavity 50. Each gate cavity 59 is laterally confined by the vertical sidewalls of the gate-level dielectric layer 50.

Figure 7:
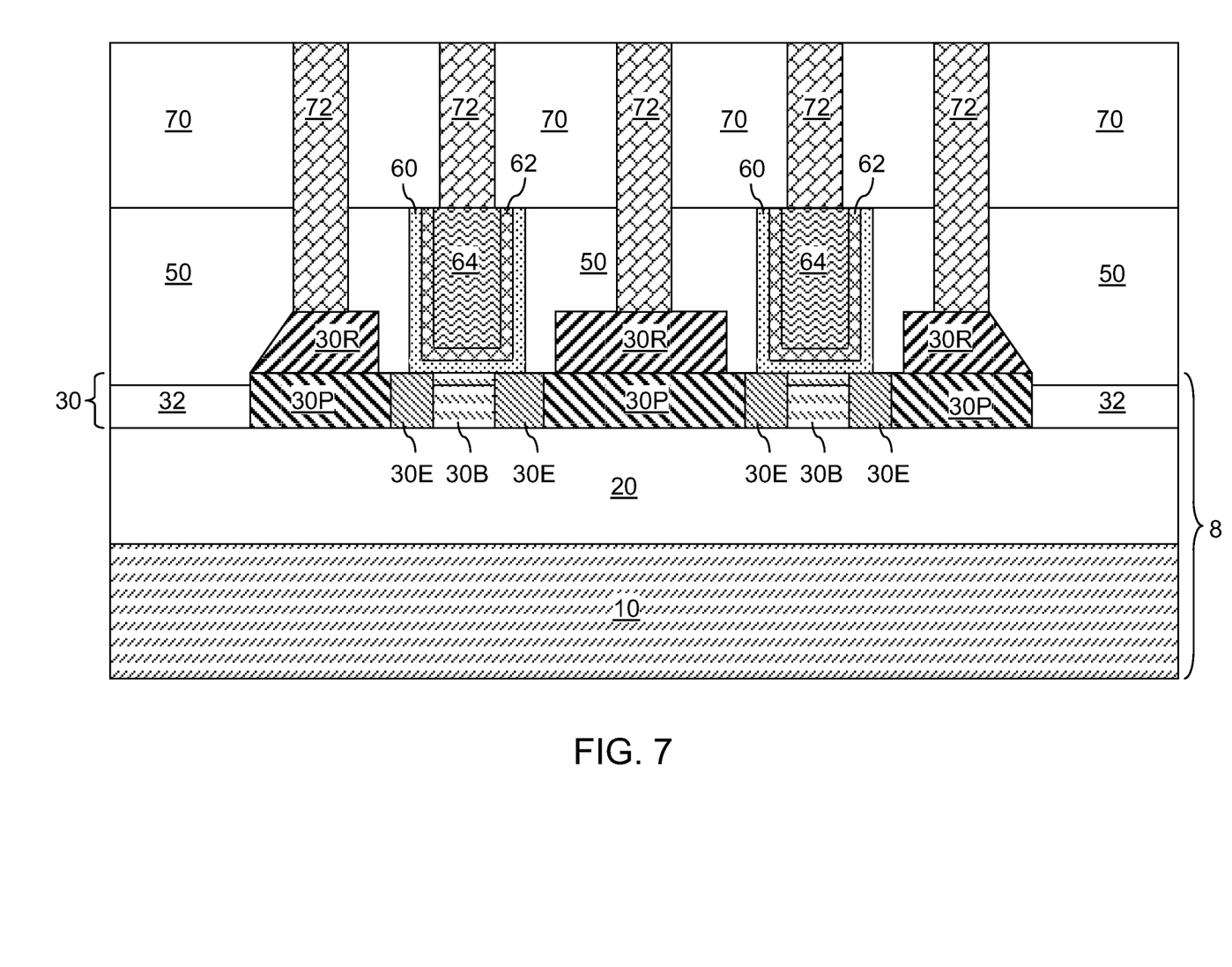
FIG. 7 is a vertical cross-sectional view of the first exemplary semiconductor structure of FIG. 6 after formation of replacement gate stacks, a contact-level dielectric layer, and contact via structures.

Referring to FIG. 7, a gate stack, which is herein referred to as a replacement gate stack, is formed in each gate cavity 59. Each replacement gate stack includes, from bottom to top, and from outside to inside, a gate dielectric 60 and a gate electrode including at least one conductive material portion. The gate dielectric 60 can be, for example, a U-shaped gate dielectric including a horizontal gate dielectric portion that contacts a body region 30B and peripheral portions of two source/drain extension regions 30E and vertical gate dielectric portions having a substantially constant width and contacting sidewalls of the gate-level dielectric layer 50.

In one embodiment, the gate dielectric 60 is formed by a conformal or non-conformal deposition of a dielectric material. The gate dielectric(s) 60 can be formed by depositing a gate dielectric layer on a semiconductor surface of the semiconductor substrate 8 within each gate cavity 59 and the sidewalls and the top surface of the gate-level dielectric layer, and subsequently removing portions of the gate dielectric layer above the gate-level dielectric layer 50. The gate dielectric 60 is a U-shaped gate dielectric that contiguously extends from the top surface of the semiconductor substrate 8 to the top surface of the gate-level dielectric layer 50. For example, the gate dielectric can be composed of a high dielectric constant (high-k) dielectric material including a dielectric metal oxide and having a dielectric constant greater than 8.0. The dielectric metal oxide is a high-k material including a metal and oxygen, and optionally nitrogen. For example, the high-k dielectric material may comprise one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2.

The high-k dielectric material may be formed by methods well known in the art including, for example, chemical vapor deposition (CVD), atomic layer deposition (ALD), molecular beam epitaxy (MBE), pulsed laser deposition (PLD), liquid source misted chemical deposition (LSMCD), etc. The thickness of the gate dielectric 60 in this embodiment can be from about 2 nm to about 6 nm, and may have an effective oxide thickness on the order of or less than 1 nm, although lesser and greater thicknesses can also be employed.

In another embodiment, the gate dielectric 60 is a dielectric material derived from conversion of a surface portion of the top semiconductor layer 30 by oxidation, nitridation, or a combination thereof. For example, the gate dielectric 60 can be silicon oxide, silicon nitride, silicon oxynitride, or a combination thereof. In this embodiment, the gate dielectric 60 is a planar layer that is formed only on the exposed surface of the top semiconductor layer 30. The thickness of the gate dielectric 60 in this embodiment can be from about 1 nm to about 6 nm, although lesser and greater thicknesses can also be employed.

In yet another embodiment, the gate dielectric 60 can be a U-shaped gate dielectric including a horizontal portion and vertical portions. The horizontal portion can include a stack of a dielectric material derived from conversion of a surface portion of the top semiconductor layer 30 by oxidation, nitridation, or a combination thereof and a high-k dielectric material including a dielectric metal oxide and having a dielectric constant greater than 8.0. The vertical portions can include only the high-k dielectric material. In this case, the horizontal portion can be thicker than the vertical portions.

The gate electrode(s) can be formed by depositing at least one gate conductor layer in each gate cavity 50 to fill each gate cavity 59, and subsequently removing excess portions of the at least one gate conductor layer above the gate-level dielectric layer 50. In one embodiment, the at least one gate conductor layer can includes a stack, from bottom to top, and from outside to inside, of a work function metal layer and a conductive material layer. In this case, a gate electrode includes a stack, from bottom to top, and from outside to inside, of a work function metal portion 62 and a gate conductor portion 64. The gate conductor portion 64 can include a metallic material and/or a doped semiconductor material.

In an embodiment in which a gate electrode (62, 64) includes a work function metal portion 62, a work function metal layer can be formed directly on the high dielectric constant material layer, for example, by chemical vapor deposition (CVD), physical vapor deposition (PVD), atomic layer deposition (ALD), etc. The work function metal layer comprises a conductive metallic material which may be a metal, a metal alloy, or a metallic nitride. For example, the work function metal layer may comprise a material such as TaN, TiN, WN, TiAlN, TaCN, other conductive refractory metallic nitrides, an alloy thereof, or any other metallic layer that is known to provide suitable work function for a field effect transistor. The thickness of the work function metal layer can be from about 5 nm to about 40 nm, and preferably from about 7 nm to about 20 nm, although lesser and greater thicknesses can also be employed. If a doped semiconductor material is employed within the gate conductor portion 64, the doped semiconductor material can includes a polycrystalline semiconductor material having a p-type doping or an n-type doping.

The excess dielectric material of the gate dielectric layer, in case the material of the gate dielectric 60 is formed by deposition, and the excess portions of the at least one gate conductor layer above the gate-level dielectric layer 50 can be removed, for example, by a recess etch, chemical mechanical planarization (CMP), or a combination thereof. After planarization, the work function metal portion 62 and the gate conductor portion 64 can be coplanar with the top surfaces of the gate-level dielectric layer 50. Further, if the gate dielectric 60 is a U-shaped dielectric, the top surface of the gate dielectric 60 is also coplanar with the top surfaces of the gate-level dielectric layer 50. A gate dielectric 60 and a gate electrode (62, 64) collectively constitute a replacement gate stack (60, 62, 64).

A pair of raised source/drain regions 30R is laterally spaced from a gate stack (60, 62, 64) by a same distance, which corresponds to the thickness of the disposable gate spacer 46 (See FIG. 3) that is removed at a processing step of FIG. 4. The processing steps of FIGS. 6 and 7 replace each of the at least one disposable gate stack 48 with a replacement gate stack (60, 62, 64).

A contact-level dielectric layer 70 is deposited over the gate-level dielectric layer 50 and the at least one replacement gate stack (60, 62, 64) employing methods known in the art. Further, at least one contact via structure 72 is formed to provide electrical contact to the at least one gate electrode (62, 64) and the raised source/drain regions 30R.

In some embodiments of the present disclosure, different types of gate electrodes can be formed by employing different material stacks for the at least one gate conductor layer and by lithographically patterning various layers within the material stacks. For example, the different types of gate electrodes can be formed for p-type field effect transistors including p-doped raised source/drain regions and for n-type field effect transistors including n-doped raised source/drain regions.

Figure 8:
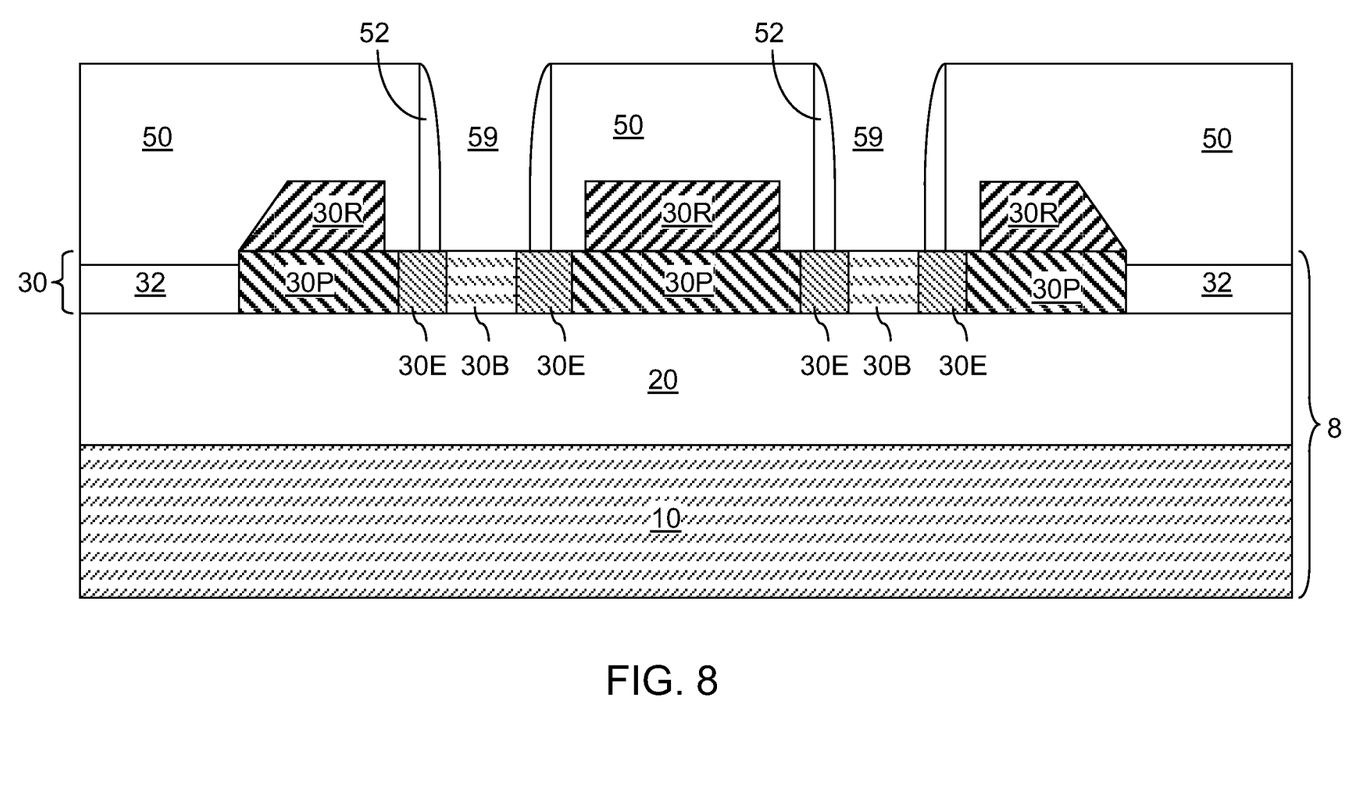
FIG. 8 is a vertical cross-sectional view of a second exemplary semiconductor structure after formation of a dielectric gate spacer according to a second embodiment of the present disclosure.

Referring to FIG. 8, second exemplary semiconductor structure according to a second embodiment of the present disclosure is derived from the first exemplary semiconductor structure of FIG. 6 by forming a dielectric gate spacer 52 on sidewalls of each gate cavity 59.

As discussed above, vertical surfaces of the gate-level dielectric layer 50 are exposed on the sidewalls of each gate cavity 59 upon removal of the at least one the disposable material stack 48. The at least one dielectric gate spacer 52 can be formed by depositing a conformal dielectric material layer and anisotropically etching horizontal portions of the conformal dielectric material layer. The remaining vertical portions of the conformal dielectric material layer become the at least one dielectric gate spacer 52. The at least one dielectric gate spacer 52 includes a dielectric material such as silicon oxide, silicon nitride, silicon oxynitride, organosilicate glass (OSG), or a combination thereof.

Figure 9:
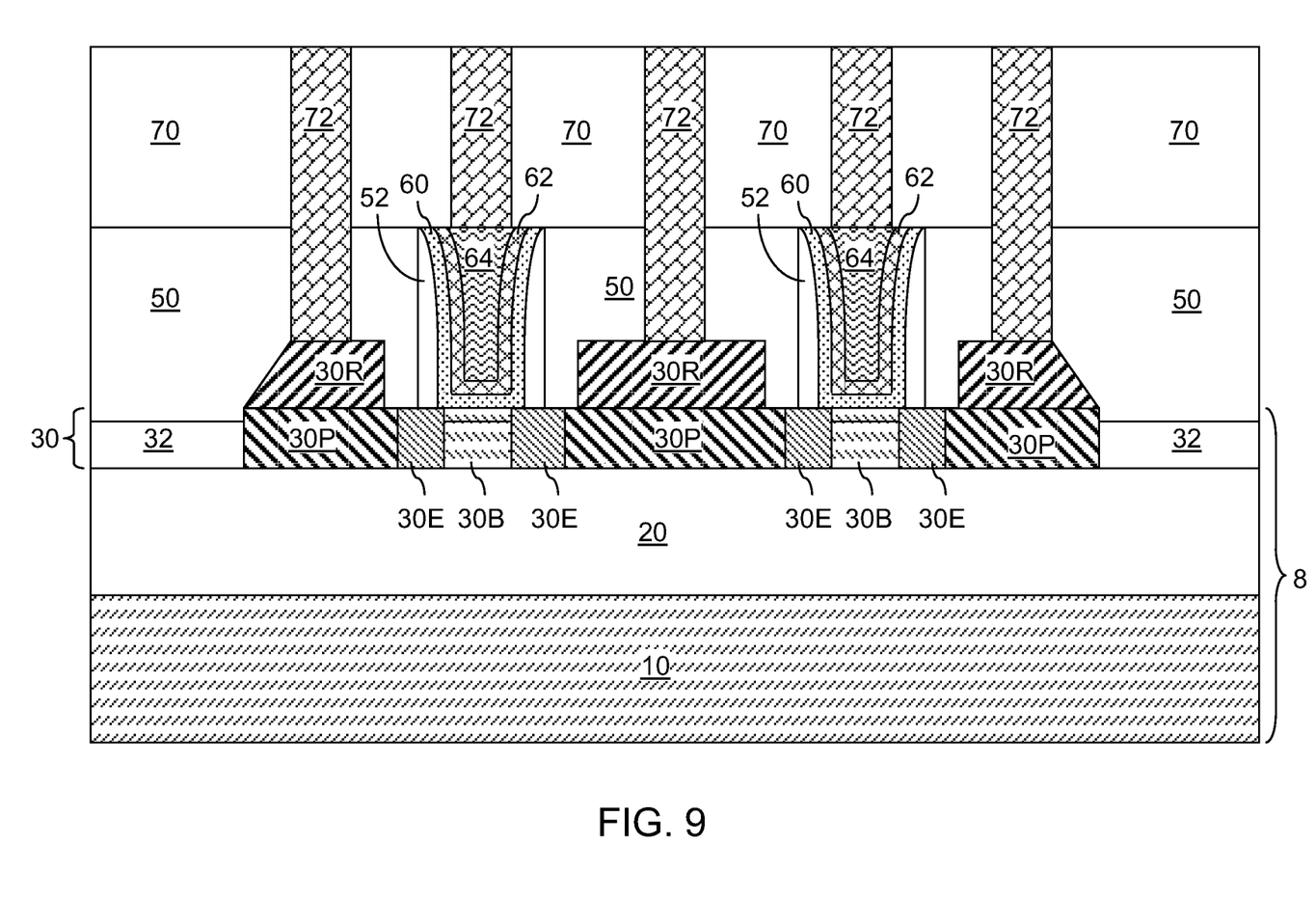
FIG. 9 is a vertical cross-sectional view of the second exemplary semiconductor structure of FIG. 8 after formation of replacement gate stacks, a contact-level dielectric layer, and contact via structures.

Referring to FIG. 9, the processing steps of FIG. 7 of the first embodiment can be employed to form replacement gate stacks (60, 62, 64), a contact-level dielectric layer 70, and contact via structures 72.

The width of the at least one dielectric gate spacer 52, as measured at the base of each of the at least one dielectric gate spacer 52, can be from 1% to 40%, and typically from 5% to 20%, of the width of a gate cavity 59 for minimum dimension devices, i.e., devices having a minimum feature size supported by lithographic techniques. As of 2010, the minimum dimension printable by lithographic techniques is about 32 nm. The at least one dielectric gate spacer 52 can be employed to effectively shorten the gate length below the minimum dimension printable by lithographic techniques, i.e., to provide a sub-lithographic gate length.

A replacement gate stack (60, 62, 64) of FIG. 9 is laterally spaced from a pair of raised source/drain regions 30R belonging to a same field effect transistor by a lateral dimension, which is the sum of the width of the disposable dielectric spacer 46 (See FIG. 3) and the width of a dielectric gate spacer 52. Each dielectric gate spacer 52 laterally contacting a gate dielectric 60, which can be a U-shaped gate dielectric, and the outer sidewalls of the dielectric gate spacer are vertical and contacts the gate-level dielectric layer 50. Further, the upper portion of the inner sidewalls of each dielectric gate spacer 52 can be convex, and the lower portion of the inner sidewalls of each dielectric gate spacer 52 can be vertical.

While the disclosure has been described in terms of specific embodiments, it is evident in view of the foregoing description that numerous alternatives, modifications and variations will be apparent to those skilled in the art. For example, though the present disclosure is described with exemplary structures including a field effect transistor and an antifuse structure, the present disclosure may be practiced without any field effect transistor. Accordingly, the disclosure is intended to encompass all such alternatives, modifications and variations which fall within the scope and spirit of the disclosure and the following claims.

What is claimed is:

1. A semiconductor structure comprising a field effect transistor located on a semiconductor substrate, said field effect transistor comprising:
    a semiconductor portion including a body region, source/drain extension regions laterally contacting said body region, and planar source/drain regions laterally contacting said source/drain extension regions and having a same type of doping as said source/drain extension regions;
    a gate stack, from bottom to top, of a gate dielectric and a gate conductor, wherein said gate stack contacts said body region and a portion of each of said source/drain extension regions;
    raised source/drain regions having a same type of doping as said source/drain extension regions, wherein each of said raised source/drain regions contacts a top surface of said planar source/drain regions and is laterally spaced from said gate stack by a same distance; and
    a gate-level dielectric layer contacting top surfaces of said source/drain extension region, top surfaces of said planar source/drain region, and top surfaces and sidewalls of said raised source/drain regions.

2. The semiconductor structure of claim 1, wherein said gate-level dielectric layer further contacts sidewalls of said gate dielectric.

3. The semiconductor structure of claim 1, further comprising a dielectric gate spacer laterally contacting said gate dielectric, wherein outer sidewalls of said dielectric gate spacer are vertical.

4. The semiconductor structure of claim 3, wherein said gate-level dielectric layer contacts said outer sidewalls of said dielectric gate spacer.

5. The semiconductor structure of claim 1, wherein said raised source/drain regions are epitaxially aligned to said planar source/drain regions.

6. The semiconductor structure of claim 1, wherein a top surface of said body region, top surfaces of said source/drain extension regions, and top surfaces of said planar source/drain regions are located within a same horizontal plane.

7. The semiconductor structure of claim 1, wherein the raised source/drain regions have a thickness of 5 nm to 100 nm.

8. The semiconductor structure of claim 1, wherein the body region includes an active region composed of a single crystal semiconductor material.

9. The semiconductor structure of claim 1, wherein the body region is composed of a semiconductor material that is different from a semiconductor material for the raised source/drain regions.

10. The semiconductor structure of claim 1, wherein the body region and the planar source/drain regions are composed of a semiconductor material having a same composition.

11. The semiconductor structure of claim 1, wherein the planar source/drain regions have a greater dopant concentration than the source/drain extension regions.

12. The semiconductor structure of claim 1, wherein a dopant concentration of the planar source/drain regions ranges from $3.0 \times 10^{20}/cm^3$ to $3.0 \times 10^{21}/cm^3$, and a dopant concentration of the source/drain extension regions ranges from $1.0 \times 10^{19}/cm^3$ to $3.0 \times 10^{20}/cm^3$.

13. The semiconductor structure of claim 1, wherein the gate dielectric is selected from the group consisting of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and a combination thereof, wherein a value of x is from about 0.5 to about 3 and each value of y is from 0 to about 2.

14. The semiconductor structure of claim 1, wherein the gate dielectric has a thickness ranging from 1 nm to 6 nm.

15. The semiconductor structure of claim 1, wherein the gate conductor comprises a work function metal portion.

16. The semiconductor structure of claim 14, wherein the work function metal portion comprises a metal, a metal alloy, or a metallic nitride.

17. The semiconductor structure of claim 14, wherein the work function metal portion comprises TaN, TiN, WN, TiAlN, TaCN or a combination thereof.

* * * * *